(12) United States Patent
Sato et al.

(10) Patent No.: US 9,409,824 B2
(45) Date of Patent: Aug. 9, 2016

(54) CERAMIC MATERIAL AND SPUTTERING TARGET MEMBER

(71) Applicant: NGK Insulators, Ltd., Nagoya (JP)

(72) Inventors: Yosuke Sato, Hashima-Gun (JP); Yoshinori Isoda, Ichinomiya (JP); Yuji Katsuda, Tsushima (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 14/692,955

(22) Filed: Apr. 22, 2015

(65) Prior Publication Data

US 2015/0225298 A1    Aug. 13, 2015

Related U.S. Application Data

(63) Continuation of application No. PCT/JP2013/078840, filed on Oct. 24, 2013.

(30) Foreign Application Priority Data

Nov. 7, 2012    (JP) ................. 2012-245464

(51) Int. Cl.
  *C04B 35/053*    (2006.01)
  *C04B 35/04*     (2006.01)
  (Continued)

(52) U.S. Cl.
  CPC .............. *C04B 35/04* (2013.01); *C01G 25/006* (2013.01); *C04B 35/053* (2013.01); *C23C 14/08* (2013.01); *C23C 14/3414* (2013.01); *G01R 33/0052* (2013.01); *G01R 33/098* (2013.01); *G11B 5/3909* (2013.01); *H01L 43/10* (2013.01);
  (Continued)

(58) Field of Classification Search
  CPC .... C04B 35/04; C04B 35/053; C23C 14/3414
  See application file for complete search history.

(56) References Cited

U.S. PATENT DOCUMENTS

2005/0045065 A1* 3/2005 Sakurai ................ C04B 35/053
                                                             106/286.8
2006/0056115 A1   3/2006 Djayaprawira et al.
(Continued)

FOREIGN PATENT DOCUMENTS

JP         08-281418 A1    10/1996
JP      2005-330589 A1    12/2005
(Continued)

OTHER PUBLICATIONS

Translation of the International Preliminary Report on Patentability, International Application No. PCT/JP2013/078840, dated May 21, 2015 (8 pages).
(Continued)

*Primary Examiner* — Karl Group
(74) *Attorney, Agent, or Firm* — Burr & Brown, PLLC

(57) ABSTRACT

A ceramic material of the present invention contains magnesium, zirconium, lithium, and oxygen as main components. The crystal phase of a solid solution obtained by dissolving zirconium oxide and lithium oxide in magnesium oxide is a main phase. The XRD peak of a (200) plane of the solid solution with CuKα rays preferably appears at 2θ=42.89° or less which is smaller than an angle at which a peak of a cubic crystal of magnesium oxide appears. The XRD peak more preferably appears at 2θ=42.38° to 42.89° and further preferably at 2θ=42.82° to 42.89°. In the ceramic material, the molar ratio Li/Zr of Li to Zr is preferably in the range of 1.96 or more and 2.33 or less.

15 Claims, 5 Drawing Sheets

(51) Int. Cl.
  *H01L 43/10* (2006.01)
  *H01L 43/12* (2006.01)
  *G11B 5/39* (2006.01)
  *C23C 14/08* (2006.01)
  *C23C 14/34* (2006.01)
  *G01R 33/09* (2006.01)
  *C01G 25/00* (2006.01)
  *G01R 33/00* (2006.01)

(52) U.S. Cl.
  CPC ............ *H01L43/12* (2013.01); *C01P 2002/72* (2013.01); *C01P 2002/74* (2013.01); *C01P 2006/14* (2013.01); *C04B 2235/3203* (2013.01); *C04B 2235/3244* (2013.01); *C04B 2235/76* (2013.01); *C04B 2235/77* (2013.01)

(56) References Cited

U.S. PATENT DOCUMENTS

| | | |
|---|---|---|
| 2008/0055793 A1 | 3/2008 | Djayaprawira et al. |
| 2008/0124454 A1 | 5/2008 | Djayaprawira et al. |
| 2008/0180862 A1 | 7/2008 | Djayaprawira et al. |
| 2011/0094875 A1 | 4/2011 | Djayaprawira et al. |
| 2012/0231945 A1 | 9/2012 | Watanabe et al. |
| 2014/0145185 A1* | 5/2014 | Ebata ............... C23C 14/08 257/43 |
| 2014/0284212 A1* | 9/2014 | Hisano ............... C04B 35/053 204/298.13 |

FOREIGN PATENT DOCUMENTS

| | | |
|---|---|---|
| JP | 2006-080116 A1 | 3/2006 |
| JP | 2007-305610 A1 | 11/2007 |
| WO | 2012/056808 A1 | 5/2012 |

OTHER PUBLICATIONS

Takashi Okamoto et al., "*Thermal Shock Resistance of ZrO$_2$-Toughened MgO,*" Journal of the Ceramic Society of Japan, 1989, vol. 97, No. 8, pp. 812 to 817.

International Search Report and Written Opinion (Application No. PCT/JP2013/078840) dated Feb. 4, 2014.

* cited by examiner

CERAMIC MATERIAL AND SPUTTERING TARGET MEMBER

BACKGROUND OF THE INVENTION

1. Field of the Invention

The present invention relates to a ceramic material and a sputtering target member, and more specifically to a ceramic material and a splattering target member containing magnesium oxide as a main component.

2. Description of the Related Art

Magnesium oxide (MgO) has been used for refractories, additives, electronic components, fluorescent materials, raw materials for target members, raw materials for superconducting thin film bases, tunnel barriers of magnetic tunnel junction elements (hereafter, MTJ elements), protective films for color plasma display panels (PDPs), and the like and have received attention as a material for a very wide range of uses. In particular, sputtering target members are used for forming tunnel barriers of MTJ elements that use a tunneling magnetoresistance effect. The tunneling magnetoresistance effect is a resistance-change phenomenon that occurs, in an MTJ element in which a very thin insulator with a thickness of several nanometers is sandwiched between two magnetic layers, when the relative directions of magnetization of the two magnetic layers are parallel or antiparallel. The tunneling magnetoresistance effect is applied to, for example, a magnetic head of a hard disk using a change in electrical resistance in the magnetization states.

In recent, years, magnetoresistive random access memory (hereafter, MRAM) that uses the above-described MTJ elements has been studied (e.g., refer to PTL 1). In MRAM, for example, many MTJ elements are arranged and the magnetization alignment of each of the MTJ elements is used for an information carrier. MRAM has characteristics such as nonvolatility, high-speed operation, and high endurance for many writings, and thus has been developed: as memory that surpasses known semiconductor memories (e.g., SRAM and DRAM). Memories whose storage capacity is several megabits (Mbit) to several tens of megabits (Mbit) have been made on an experimental basis so far. However, the storage capacity needs to be further increased to a gigabit (Gbit) level to replace, for example, DRAM with MRAM.

Single crystal MgO or high-purity MgO have been generally used for film bodies of tunnel barriers of MTJ elements, and such a tunnel barrier has been generally formed by sputtering with a sputtering target member composed of a high-purity MgO sintered body. In recent years, however, an insulating film in which the tunneling magnetoresistance can be artificially changed by using a tunnel barrier in which part of MgO is replaced has been developed (e.g., refer to PTL 2 and PTL 3).

CITATION LIST

Patent Literature

PTL 1: Japanese Unexamined Patent Application Publication No. 2006-80116
PTL 2: Japanese Unexamined Patent Application Publication No. 2007-305610
PTL 3: International Publication No. 2012/056808

SUMMARY OF INVENTION

When a film body in which part of MgO is replaced is produced, an element to be replaced with MgO is sputtered using a different target (co-sputtering) or an element to be replaced with MgO is sputtered using a single sputtering target containing different compounds (composite target). However, it can be easily imagined in the co-sputtering that the apparatus and process are complicated. In the composite target, when sputtering rates of the compounds are different from each other, a compound with a low sputtering rate may generate dust from the target. Therefore, when a film body in which part of MgO is replaced is produced, the sputtering target is also desirably a sintered body in which part of MgO is replaced.

It is known that, for example, CoO and FeO form a complete solid solution with MgO, and a sintered body in which part of MgO is replaced can be easily produced using Co and Fe. However, other elements are not dissolved in MgO or are only dissolved in a high-temperature region, and thus a solid solution is often not produced at room temperature. For example, it is known that Al is dissolved in MgO in a high-temperature region, but is precipitated as spinel at room temperature. Therefore, a solid solution in which part of MgO is replaced with Al cannot be produced at room temperature, except for a special method such as quenching. This may be because of the difference in valence number between Mg and Al. In PTL 3, a solid solution obtained by dissolving Al whose valence number is different from Mg is stably produced at room temperature by adding AlN and $Al_2O_3$ together to MgO. The ceramic material in PTL 3 includes, as a main phase, a crystal phase of an MgO—AlN solid solution obtained by dissolving an aluminum nitride component in magnesium oxide and has higher moisture resistance and water resistance than magnesium oxide.

However, in PTL 3, cation defects may be formed in Mg sites. Although the functions of the ceramic material are improved, defects are believed to be included in a crystal structure of the solid solution.

In view of the foregoing, it is a main object of the present invention to provide a novel ceramic material obtained by dissolving zirconium in magnesium oxide and a sputtering target member.

As a result of extensive studies conducted to achieve the above main object, the present inventors have found that zirconium oxide and lithium, oxide can be dissolved in magnesium oxide by adding zirconium oxide to magnesium oxide and also adding a component for generating lithium oxide under heating. Thus, the present invention has been completed.

A ceramic material according to the present invention includes: magnesium, zirconium, lithium, and oxygen as main components, wherein a crystal phase of a solid solution obtained by dissolving zirconium oxide and lithium oxide in magnesium oxide is a main phase.

A sputtering target member of the present invention is made of the above-described ceramic material.

In the present invention, a novel material obtained by dissolving zirconium oxide and lithium oxide in magnesium oxide can be provided. FIG. 1A and FIG. 1B schematically show solid solutions in the case where zirconium oxide and lithium oxide are dissolved in magnesium oxide. FIG. 1A shows the case where lithium does not coexist and FIG. 1B shows the case where lithium coexists. In general, zirconium oxide ($ZrO_2$) is dissolved in magnesium oxide (MgO) in a trace amount at high temperature, but a solid solution in which magnesium oxide is replaced with zirconium oxide in a high concentration cannot be obtained at room temperature. The reason for this may be as follows. When part of magnesium oxide is replaced with zirconium oxide, cation defects are formed in magnesium sites to keep electroneutrality because the valence number of magnesium is 2 whereas the valence number of zirconium is 4. Thus, structural instability is caused at room temperature (FIG. 1A). In contrast, the present invention can provide a material in which zirconium oxide and lithium oxide are dissolved in part of magnesium oxide at room temperature. This may be because part of magnesium is replaced with zirconium and the thus-formed cation defects are replaced with lithium, and thus the electroneutrality can foe kept without forming cation defects (FIG. 1B). Furthermore, since a solid solution in which part of magnesium is replaced with zirconium and lithium is obtained at room temperature, a film body in which part of magnesium is replaced with zirconium and lithium can be obtained by performing sputtering that uses the ceramic material. For the above reason, cation defects are not easily formed in the film body. Therefore, when an MTJ element is produced, it is likely that a high magnetoresistance ratio is achieved and also a tunnel barrier is formed in which the tunnel resistance can be artificially changed, for example, the tunnel resistance is decreased by affecting the MgO tunnel barrier height through doping of zirconium and lithium. In addition, since the dissolution of zirconium oxide and lithium oxide changes the lattice constant of magnesium oxide, the lattice constant can foe adjusted in accordance with the amounts of zirconium oxide and lithium oxide dissolved. As a result, the lattice matching with a material on which a film is formed can be controlled. For example, the lattice matching with a magnetic layer in the MTJ element may be controlled.

DESCRIPTION OF THE PREFERRED EMBODIMENTS

Figure 1A:
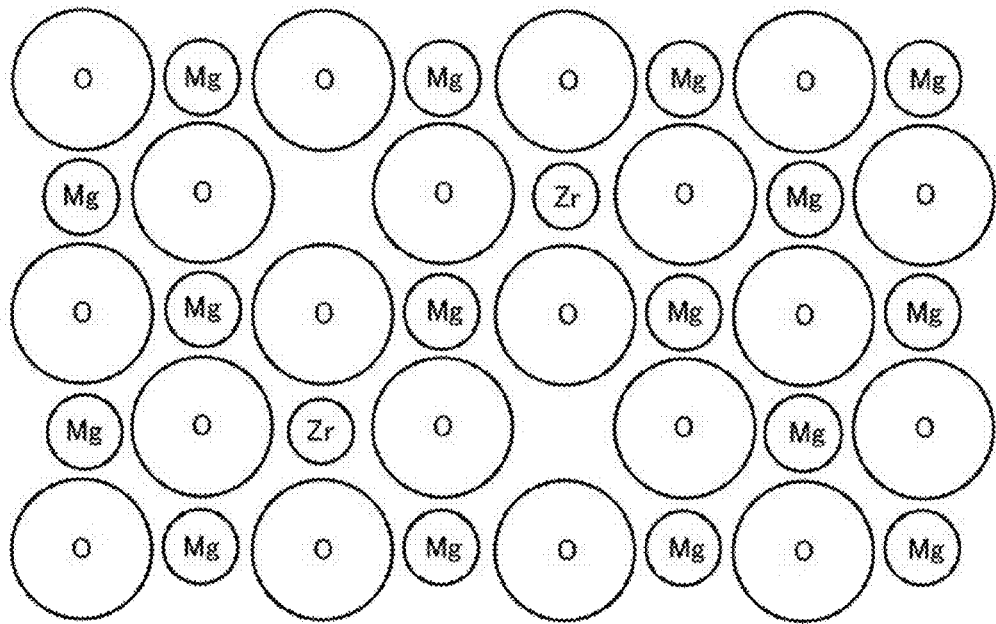
FIG. 1A and FIG. 1B schematically show solid solutions in the case where zirconium oxide is dissolved in magnesium oxide and the case where zirconium oxide and lithium oxide are dissolved in magnesium oxide.

A ceramic material of the present invention contains magnesium (Mg), zirconium (Zr), lithium (Li), and oxygen (O) as main components. The crystal phase of an $MgO$—$ZrO_2$—$Li_2O$ solid solution (a solid solution of the present invention, also simply referred to as a solid solution hereafter) obtained by dissolving zirconium oxide and lithium oxide in magnesium oxide is a main phase.

In this ceramic material, an XRD peak of a (200) plane of the solid solution with CuKα rays preferably appears at $2\theta=42.89°$ or less which is smaller than an angle at which a peak of a cubic crystal of magnesium oxide appears. When the crystal phase of the $MgO$—$ZrO_2$—$Li_2O$ solid solution obtained by dissolving zirconium oxide and lithium oxide in magnesium oxide is formed, such a peak shift in XRD is believed to occur. As the amounts of the zirconium oxide and lithium oxide dissolved increase, the XRD peak of the magnesium oxide shifts to lower angles. However, if the amounts of the zirconium oxide and lithium oxide added are excessively increased, the zirconium oxide and lithium oxide are not completely dissolved, which readily generates minor phases (heterogeneous phases). Therefore, the XRD peak of a (200) plane of the solid solution preferably appears at $2\theta=42.38°$ to $42.89°$. This range is preferred because the amount of minor phases generated decreases. The XRD peak of a (200) plane of the solid-solution more preferably appears at $2\theta=42.82°$ to $42.89°$. This range is particularly preferred because minor phases are substantially not contained.

The ceramic material of the present invention may contain, for example, magnesium-zirconium composite oxide and zirconium oxide ($ZrO_2$) as minor phases. An example of the magnesium-zirconium composite oxide is $Mg_xZr_{x-x}O_{2-x}$ ($0<x<0.25$). In addition to this phase, the ceramic material of the present invention may contain unknown components, but the content of the minor phases is preferably as low as possible. For example, the content of the minor phases is preferably 25 vol % or less (the content of the main phase is 75 vol % or more), more preferably 15 vol % or less (the content of the main phase is 85 vol % or more), and further preferably 10 vol % or less (the content of the main phase is 90 vol % or more), Herein, the main phase refers to a component whose content is 50% or more on a volume basis. The minor phases are phases, other than the main phase, which are identified from XRD peaks or EPMA element mapping images. The main phase and the minor phases can be determined by observing a cross-section, of the ceramic material with an electron microscope (SEM) to obtain an EPMA element mapping image. The area ratio measured by the cross-sectional observation is considered to reflect the volume ratio. Therefore, the main phase is defined as a region that occupies an area of 50% or more, which is determined by the microstructure observation with a SEM and the EPMA element mapping image. The minor phases are defined as regions other than the region of the main phase.

In the ceramic material of the present invention, (B+C)/A is preferably lower than 0.11, where A represents an XRD peak area of the (200) plane of the solid solution, B represents an XRD peak area of a (111) plane of $Mg_xZr_{1-x}O_{2-x}$ ($0<x<0.25$) serving as a minor phase, and C represents an XRD peak area of a (111) plane of $ZrO_2$ serving as a minor phase, A lower value of (B+C)/A means a lower content of the minor phases. The value of (B+C)/A is preferably lower than 0.06 and more preferably lower than 0.03. When the ceramic material is used as a sputtering target, the ceramic material preferably does not contain the minor phases.

In the ceramic material of the present invention, the molar ratio Li/Zr of Li to Zr is preferably in the range of 1.96 or more and 2.33 or less. In consideration of the valence number of Mg, the valence number of Zr, and the valence number of Li, the molar ratio Li/Zr is ideally preferably 2.00. The molar ratio Li/Zr is determined by performing the chemical analysis of the ceramic material. The chemical analysis can be performed, for example, by dissolving the ceramic material and then performing chelatometry for Mg and inductively coupled plasma-atomic emission spectroscopy for Zr and Li.

In the ceramic material of the present invention, assuming that contents of compounds containing magnesium, zirconium, and lithium, the compounds being contained in a starting material, are respectively calculated, based on magnesium oxide (MgO), zirconium oxide ($ZrO_2$), and lithium oxide ($Li_2O$) and the total content of the magnesium oxide, the zirconium oxide, and the lithium oxide is 100 mol %, the content of the magnesium oxide is preferably 60.0 mol % or more and 99.8 mol % or less, the content of the zirconium oxide is preferably 0.1 mol % or more and 20.0 mol % or less, and the content of the lithium oxide is preferably 0.1 mol % or more and 20.0 mol % or less. In these ranges, zirconium oxide can be dissolved in magnesium oxide. Furthermore, the content of the magnesium oxide is more preferably 90.0 mol % or more and 99.8 mol % or less, the content of the zirconium oxide is more preferably 0.1 mol % or more and 5.0 mol % or less, and the content of the lithium oxide is more preferably 0.1 mol % or more and 5.0 mol % or less. Herein, the molar ratio of lithium oxide to zirconium oxide is preferably about 1 and more preferably 1 or more. These ranges are more preferably employed because the minor phases are substantially not contained. Note that the molar ratio is preferably 5 or less.

In the ceramic material of the present invention, in the solid solution, an XRD peak measured with CuKα rays may shift to lower angles with respect to an XRD peak of magnesium oxide measured with CuKα rays. Herein, the XRD peak of the solid solution shifts to lower angles by preferably 0.01° or more and 0.10° or less and more preferably 0.08° or less with respect to the XRD peak of magnesium oxide. When a crystal phase of an MgO—$ZrO_2$—$Li_2O$ solid solution obtained by dissolving zirconium oxide and lithium oxide in magnesium oxide is formed, such a peak shift in XRD is believed to occur. Herein, the phrase "with respect to an XRD peak of magnesium oxide" indicates that, if the ceramic material is formed on a base, an XRD peak of the ceramic material formed on the base shifts to lower angles with respect to an XRD peak measured in the same state as that of the ceramic material, for example, in the state in which the magnesium oxide is formed on the same base.

The ceramic material of the present invention may be formed in a film-like shape. For example, a film body may be formed on a base by using the ceramic material of the present invention as a sputtering target and performing sputtering. The film body formed by sputtering also includes, as a main phase, the crystal phase of the solid solution obtained by dissolving zirconium oxide and lithium oxide in magnesium oxide. The film body may have a thickness of, for example, 1 nm or more and 1000 nm or less or 1 nm or more and 1000 µm or less. In the film body, an XRD peak measured with CuKα rays may shift to lower angles with respect to an XRD peak of magnesium oxide measured with CuKα rays. Herein, the XRD peak of the film body shifts to lower angles by preferably 0.01° or more and 0.10° or less and more preferably 0.08° or less with respect to the XRD peak of magnesium oxide. The base is not particularly limited and may be made of an inorganic material or an organic material. Examples of the base made of an inorganic material include substrates for semiconductors of silicon, silicon carbide, gallium nitride, and the like and insulating substrates composed of alumina, quartz, and the like.

In the ceramic material, the open porosity is preferably 16% or less, more preferably 8% or less, and further preferably 1% or less. Herein, the open porosity is measured by an Archimedean method that uses pure water as a medium. An open porosity of more than 16% is not preferred, because the strength may decrease, the material itself may easily generate dust due to particle detachment, and dust components are easily collected in pores during the material processing or the like. The open porosity is preferably close to zero. Therefore, the open porosity does not have a particular lower limit.

The ceramic material can be used for a sputtering target member. That is, a sputtering target member of the present invention may be made of a ceramic material including, as a main phase, the crystal phase of the solid solution obtained by dissolving zirconium oxide and lithium oxide in magnesium oxide, The ceramic material of the present invention is believed to maintain the crystal structure of magnesium oxide and have higher functions, and thus is preferably used for a sputtering target member. Herein, a ceramic material whose content of minor phases is low is preferably used for a sputtering target member. When the sputtering target member contains minor phases, the sputtering rate may be different between the main phase and the minor phases. However, if the content of the minor phases is low, the degradation of the homogeneity of a film to foe formed can be suppressed and also the generation of dust from the sputtering target member can be further suppressed. In addition, since the lattice constant of the magnesium oxide is changed by dissolving zirconium oxide and lithium oxide, the lattice constant can be adjusted in accordance with the amounts of zirconium oxide and lithium oxide dissolved. As a result, the lattice matching with a material on which a film is formed can be controlled.

The sputtering target member may be used for forming, for example, a tunnel barrier of a magnetic tunnel junction element. The dissolution of zirconium, oxide and lithium oxide generates an impurity level in a band gap of magnesium oxide, and thus an effect of decreasing the tunnel barrier height and the like are expected. The ceramic material is preferably used for producing the magnetic tunnel junction element which is at least one of a magnetic head of a hard disk and a magnetoresistive random access memory. Since they require a low electrical resistance and a high magnetoresistance ratio, the ceramic material is suitably used.

Next, a method for producing a ceramic material according to the present invention will be described. The method for producing a ceramic material according to the present invention includes a mixing step of mixing a compound containing magnesium, a compound containing zirconium, and a compound containing lithium to obtain a mixed powder and a firing step of firing the mixed powder to produce a ceramic material including, as a main phase, a crystal phase of a solid solution obtained by dissolving zirconium oxide and lithium oxide in magnesium oxide.

In the mixing step, compounds containing magnesium, zirconium, and lithium are mixed. Examples of the compounds containing magnesium, zirconium, and lithium include oxides, hydroxides, carbonates, nitrates, sulfates, and chlorides of each element. The magnesium and the zirconium are preferably in the form of oxides and the lithium is preferably in the form of carbonates or hydroxides. In the mixed powder composition, assuming that the contents of the compounds containing magnesium, zirconium, and lithium, which are contained in a starting material, are respectively calculated based on magnesium oxide (MgO), zirconium oxide ($ZrO_2$), and lithium oxide ($Li_2$) and the total content of the magnesium oxide, the zirconium oxide, and the lithium oxide is 100 mol %, the content of the magnesium oxide is preferably 60.0 mol % or more and 99.8 mol % or less, the content of the zirconium oxide is preferably 0.1 mol % or more and 20.0 mol % or less, and the content of the lithium oxide is preferably 0.1 mol % or more and 20.0 mol % or less. In these ranges, zirconium oxide can be dissolved in magnesium oxide. Furthermore, the content of the magnesium oxide is more preferably 90.0 mol % or more and 99.8 mol % or less, the content of the zirconium oxide is more preferably 0.1 mol % or more and 5.0 mol % or less, and the content of the lithium oxide is more preferably 0.1 mol % or more and 5.0 mol % or less. Assuming that the contents of the raw materials are calculated based on magnesium oxide, zirconium oxide, and lithium oxide, the compounds containing magnesium, zirconium, and lithium are preferably mixed so that the molar ratio of the lithium oxide to the zirconium oxide is about 1, and the molar ratio is more preferably 1 or more. This range is preferred because the minor phases are substantially not formed. Note that the molar ratio is preferably 5 or less.

In the firing step, the mixed powder is fired. In the firing step, firing may be performed in the air or hot pressing may be performed in an inert gas atmosphere. Among them, the hot pressing is preferred because the open porosity can be further decreased. In this step, the firing temperature is preferably 1200° C. or more, more preferably 1400° C. or more, and further preferably 1500° C. or more. The firing temperature is preferably high because the open porosity can be further decreased. The firing temperature is more preferably 1400° C. or more in order to further suppress the formation of minor phases. The firing temperature is preferably, for example, 2000° C. or less in view of energy consumption. When hot pressing is performed, the pressing pressure is preferably 50 to 300 kgf/cm$^2$. The atmosphere during the hot pressing is preferably an inert atmosphere such as a nitrogen atmosphere, an argon atmosphere, or a helium atmosphere. The molding pressure before firing is not particularly limited, and may be suitably set to a pressure that can retain the shape.

After the firing step, the ceramic material may be further subjected to an annealing treatment which is a heat treatment performed in an oxidizing atmosphere. The annealing treatment is preferably performed after the firing is performed in an inert atmosphere, for example, after the hot pressing. An example of the oxidizing atmosphere is an air atmosphere. The annealing treatment temperature can be determined in accordance with the balance with the firing temperature and may be, for example, 1200° C. or more or 1300° C. or more. The annealing treatment temperature may be, for example, 2000° C. or less. It is believed that, as a result of the annealing treatment, oxygen defects can be further reduced.

Figure 1B:
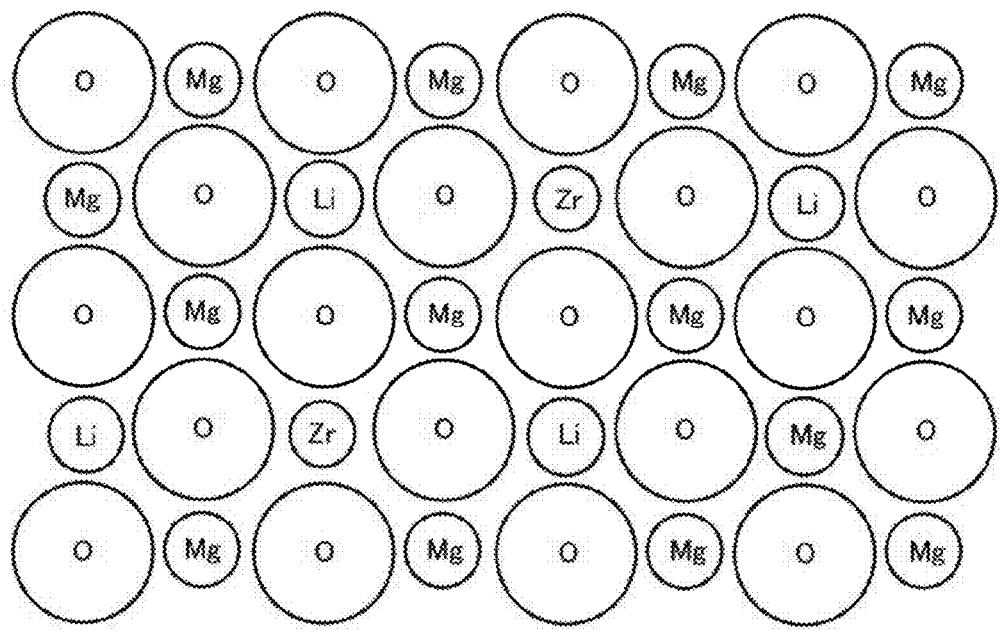

According to the above-described ceramic material and sputtering target member of this embodiment, a novel material obtained by dissolving zirconium oxide and lithium oxide in magnesium oxide can be provided. For example, when, part of MgO is replaced, with ZrO$_2$, cation defects are formed in Mg sites to keep electroneutrality because the valence number of Mg is 2 whereas the valence number of Zr is 4. Thus, structural instability is caused at room temperature. In contrast, in the ceramic material of the present invention, part of Mg is replaced with Zr and the thus-formed, cation defects are replaced with Li. As a result, the electroneutrality is kept without forming cation defects, and thus zirconium oxide and lithium oxide can be dissolved in magnesium oxide (refer to FIG. 1A and FIG. 1B). Therefore, a sputtering target that is used in a simple apparatus and process compared with co-sputtering and that does not easily generate dust compared with a composite target can be produced. For the above reason, cation defects are not easily formed. When an MTJ element is produced, it is likely that a high magnetoresistance ratio is achieved and also a tunnel barrier is formed in which the tunnel resistance can be artificially changed, for example, the tunnel resistance is decreased by doping of Zr and Li. Furthermore, since the dissolution of zirconium oxide and lithium oxide changes the lattice constant of magnesium oxide, the lattice constant can be adjusted in accordance with the amounts of zirconium oxide and lithium oxide dissolved. As a result, the lattice matching with a material on which a film is formed can be controlled. For example, the lattice matching with a magnetic layer in the MTJ element may be controlled.

The present invention is not limited to the embodiment described above, and can be realized according to various embodiments within the technical scope of the present invention.

EXAMPLE

Hereafter, examples to which the present invention is suitably applied will be described. Experimental Examples 2 to 11, 13, and 15 to 18 correspond to Examples of the present invention and Experimental Examples 1, 12, 14, and 19 correspond to Comparative Examples.

Experimental Examples 1 to 11 and 19

In a mixing step, a commercially available MgO raw material, ZrO$_2$ raw material, and Li$_2$CO$_3$ raw material were weighed so as to satisfy the mass % shown in Table 1, and mixed in a wet process for four hours using isopropyl alcohol as a solvent, a pot made of nylon, and iron-core nylon balls having a diameter of 20 mm as rounded stones. After the mixing, the resulting slurry was taken out and dried in a nitrogen stream at 110° C. Subsequently, the dried mixture was passed through a 30-mesh sieve to prepare a mixed powder. In a molding step, the mixed powder was subjected to uniaxial compression molding at a pressure of 100 kgf/cm$^3$ to produce a disc-shaped molded body having a diameter of about 35 mm and a thickness of about 10 mm. The molded body was then, pressed at 3000 kgf/cm$^2$ by cold isostatic pressing (CIP). In a firing step, the disc-shaped molded body was inserted into a sagger made of MgO and hermetically sealed, and fired in the air at a predetermined temperature. The firing was performed at the maximum temperature shown in Table 1, and the maximum temperature was kept for two hours.

Experimental Examples 12 to 15 and 17

After the mixed powder was prepared by the same method as above, the mixed powder was subjected to uniaxial compression molding at a pressure of 100 kgf/cm$^2$ to produce a disc-shaped molded body having a diameter of about 50 mm and a thickness of about 20 mm. The disc-shaped molded body was inserted into a graphite mold for firing. In a firing step, the disc-shaped molded body was subjected to hot pressing to obtain a ceramic material. In the hot pressing, the pressing pressure was 200 kgf/cm$^2$, firing was performed at the firing temperature (maximum temperature) shown in Table 1, and an N$_2$ atmosphere was kept until the completion of the firing. The firing temperature was kept for four hours.

Experimental Examples 16 and 18

The ceramic material obtained by tine hot pressing was further subjected to an annealing treatment in the air. The ceramic material obtained by the hot pressing in Experimental Example 15 was subjected to an annealing treatment. As the annealing treatment, the ceramic material was inserted into a sagger made of MgO, hermetically sealed, and fired at 1350° C. for five hours in the air to obtain a ceramic material of Experimental Example 16, The ceramic material of Experimental Example 17 was subjected to an annealing treatment in the air by the same method as above to obtain a ceramic material of Experimental Example 18.

Sample for Sputtering

Sputtering targets were produced using sintered bodies produced so as to have the compositions in Experimental Examples 13 and 14, and sputtering was performed. Each of the sputtering targets was produced as follows. The size was changed, firing was performed by the same method as in Experimental Examples 13 and 14, and processing was performed to obtain a sintered body having a diameter of 100 mm and a thickness of 3 mm. The sintered body was then joined to a backing plate. Sputtering was performed with a magnetron RF sputtering apparatus at normal temperature for 120 minutes under the following conditions: ultimate vacuum 5×10−4 Pa, sputtering gas pressure 0.1 Pa, sputtering gas 20 sccm (25° C.) in total at a ratio of Ar/$O_2$=99.5/0.5, and sputtering output 400 W, The substrate was a silicon substrate.

Evaluation

The materials produced in Experimental Examples 1 to 19 were processed into materials for various evaluations, and the following evaluations were performed. Table 1 shows the evaluation results.

(1) Bulk Density and Open Porosity

The bulk density and the open porosity were measured by an Archimedean method that uses pure water as a medium.

(2) Evaluation of Crystal Phase

Each of the materials was crushed with a mortar, and the crystal phase was identified using an X-ray diffractometer. The measurement conditions were CuKα, 40 kV, 40 mA, and 2θ=10-70°, and a sealed-tube X-ray diffractometer (D8 ADVANCE manufactured by Bruker AXS K.K.) was used. The measurement conditions for sputtered films were CuKα, 50 kV, 300 mA, and 2θ=10-70°, and an X-ray diffractometer (RINT 2000 manufactured by Rigaku Corporation) was used. The step size of the measurement was 0.02°. When the diffraction angle at a peak top was identified in a powder sample, 3 mass % of a Si standard sample powder (SRM640C) manufactured by NIST was added as an internal standard to correct the peak position. A value of ICDD 78-0430 was used as the diffraction angle at a peak top of magnesium oxide. The peak positions and the peak areas of an MgO—$ZrO_2$—$Li_2O$ solid solution were determined as follows.

(3) Peak Position

In order to relatively compare the amounts of zirconium oxide and lithium oxide dissolved in the MgO—$ZrO_2$—$Li_2O$ solid solution, the peak position of a (200) plane of the MgO—$ZrO_2$—$Li_2O$ solid solution was determined. In the measurement result, it was confirmed that diffraction peaks were detected near an MgO (111) plane (36.93°), (200) plane (42.90°), and (220) plane (62.29°) as shown in ICDD 78-0430. Then, the peak position was determined using the peak at the diffraction angle of the (200) plane as a (200) plane of the MgO—$ZrO_2$—$Li_2O$ solid solution itself.

(4) Peak Area

In order to compare relatively the ratio of a magnesium-zirconium composite oxide ($Mg_xZr_{1-r}O_{2-x}$ (0<x<0.25)) and zirconium oxide ($ZrO_2$) serving as minor phases to the entire ceramic material, XRD peak areas were calculated by the following method. A value of (B+C)/A was determined, where A represents the XRD peak area of a (200) plane of the MgO—$ZrO_2$—$Li_2O$ solid solution, B represents the area of the XRD peak (for $Mg_{0.2}Zr_{0.8}O_{1.8}$, near 2θ=30.49°) of a (111) plane of $Mg_xZr_{1-r}O_{2-x}$, and C represents the area of the XRD peak (near 2θ=31.46°) of a (111) plane of $ZrO_2$. Herein, the XRD peak areas A, B, and C were peak areas at the above angles determined from the peak search function of commercially available software JADE7 manufactured by MDI. The peak search conditions of JADE7 were set as follows. Filter type: parabolic filter, Peak position definition: peak top, Threshold σ: 3.00, Peak intensity % cutoff: 0.1, Range of BG determination: 1.0, Number of points for BG averaging: 7, Angle range: 10.0 to 70.0°, Variable filter length (data point): ON, Erase Kα2 peak: ON, Erase existing peak list: ON.

(5) Constituent Element

The detection and identification, of constituent elements and the concentration analysis of the constituent elements were performed using EPMA. A portion of the obtained sintered body was crushed with a mortar and then subjected to chemical analysis. The chemical analysis was performed by dissolving the samples for Mg, Zr, and Li and then performing chelatometry for Mg and inductively coupled plasma-atomic emission spectroscopy for Zr and Li. Mass % of O was determined by subtracting mass % of Mg, mass % of Zr, and mass % of Li from 100 mass % which was assumed to be the total. The mass percentage of each element, was divided by the atomic weight of the corresponding element, and then at % of each element, the sum of which was 100 at %, was determined. The ratio of Li to Zr (Li/Zr ratio) was determined. For the sputtered film of Experimental Example 13, the secondary ion intensities of Mg, Zr, and Li were measured by SIMS for the sintered body and the sputtered film. The same measurement conditions were applied to the sintered body and the sputtered film.

Evaluation Results

Figure 2:
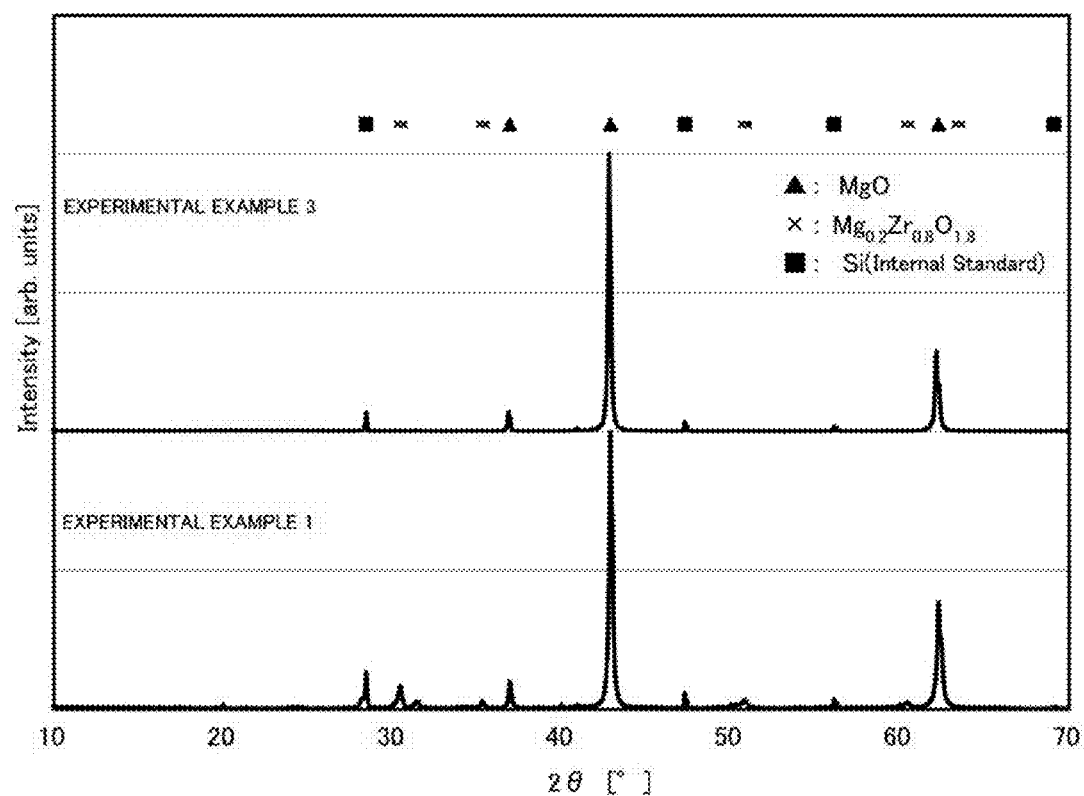
FIG. 2 shows measurement results of XRD in Experimental Examples 1 and 3.
Figure 3:
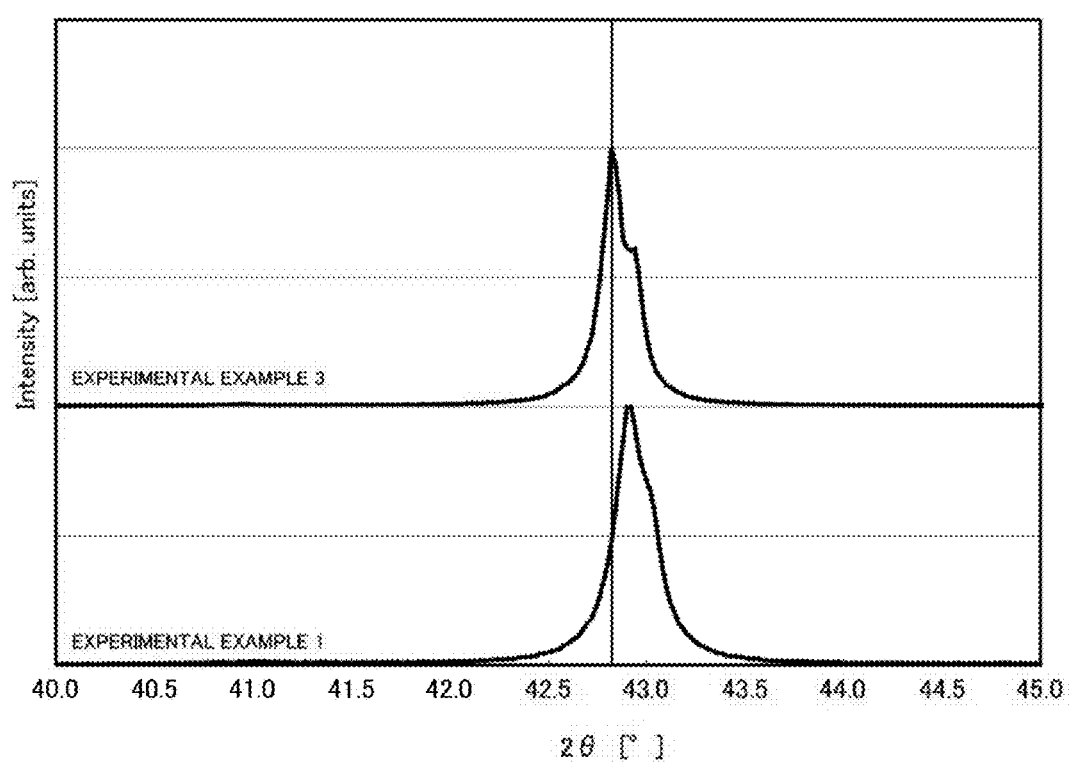
FIG. 3 is an enlarged view of peaks of solid solution crystal phases obtained by XRD measurement in Experimental Examples 1 and 3.

As a result of the evaluation of crystal phases, it was found that, in the ceramic materials of Experimental Examples 2 to 11, 13, and 15 to 18 in which $Li_2CO_3$ was added, the XRD peaks of a (111) plane, a (200) plane, and a (220) plane of the magnesium oxide shifted to lower angles. Table 1 shows, as a representative example, a peak position of the XRD peak that indicates a (200) plane near 42.90°. FIG. 2 shows XRD analysis charts of Experimental Example 1 and Experimental Example 3 as representative examples, and FIG. 3 is an enlarged view near the (200) plane. Experimental Examples other than Experimental Examples 1 and 3 are not shown because the contents of the MgO—$ZrO_2$—$Li_2O$ solid solution, $Mg_xZr_{1-r}O_{2-x}$, $ZrO_2$, and unknown phases (phases in which substances were not identified) were changed. As shown in FIGS. 2 and 3, the peak position was located at the same position as that of ICDD 78-0430 in Experimental Example 1 in which $Li_2CO_3$ was not added whereas the peak position shifted to lower angles in Experimental Examples in which $Li_2CO_3$ was added. This may be because the ionic radius of $Zr^{4+}$ (0.72 Å) is substantially equal to the ionic radius of $Mg^{2+}$ (0.72 Å) with six coordination expected in a rock salt structure and the ionic radius of $Li^{3O}$ (0.76 Å) is larger than the ionic radius of $Mg^{2+}$ (0.72 Å), and $Mg^{2+}$ was replaced, with $Zr^{4+}$ and $Li^+$ by dissolution and thus the lattice expanded. In the MgO—$ZrO_2$—$Li_2O$ solid solution, it is expected that lithium oxide is dissolved in zirconium oxide at an equimolar ratio to keep electroneutrality. Therefore, it was considered that zirconium oxide was completely dissolved and thus the minor phases were not present in Experimental Examples 3, 5 to 7, 13, and 15 to 18 in which the molar ratio Li/Zr was about 2 or more whereas minor phases derived from an excess amount of zirconium oxide were formed in Experimental Example 2 in which the molar ratio Li/Zr was less than 2 moles. In Experimental Examples 8 to 11, the minor phases were formed despite the fact that the molar ratio Li/Zr was about 2 moles. This may be because the amounts of zirconium oxide and lithium oxide added were large and thus exceeded the solid-solubility limit of MgO. In Experimental Example 4, the minor phases were also formed despite the fact that the molar ratio Li/Zr was about 2 moles. This may be because the firing temperature was low and MgO, $ZrO_2$ and $Li_2O$ were not sufficiently reacted. In Experimental Example 7, when an excess amount of $Li_2O$ relative to $ZrO_2$ was added, minor phases were not found. This may be because an excess amount of $Li_2O$ was volatilized and $Li_2O$ did not remain in the ceramic material. Note that the main phase refers to a component whose content is 50% or more on a volume basis and the minor phases refer to phases, other than the main phase, which are identified by XRD analysis or which are not identified by XRD analysis but whose peak is clearly detected. The area ratio measured by cross-sectional observation is considered to reflect the volume ratio. Therefore, the main, phase is defined as a region that occupies an area of 50% or more, which is determined by the SEM observation and the EPMA element mapping image.

zirconium oxide and lithium oxide in magnesium oxide was formed because the peak position of the (200) plane shifted to lower angles, the molar ratio Li/Zr was 2 moles or more and the minor phases were not observed, and Zr was detected in MgO. Although there is a difference in the formation of minor phases, the $MgO$—$ZrO_2$—$Li_2O$ solid solution was also considered to be formed in Experimental Examples 2, 4 to 11, and 13. Furthermore, it was found that the amount of heterogeneous phases was smaller when the XRD peak of the (200) plane appeared at 2θ=42.38° to 42.89°, and heterogeneous

TABLE 1

| Composition | Starting Material | | | | | | Firing | | Bulk |
| --- | --- | --- | --- | --- | --- | --- | --- | --- | --- |
| | MgO (mass %) | $ZrO_2$ (mass %) | $Li_2CO_3$ (mass %) | $MgO^{1)}$ (mol %) | $ZrO_2^{1)}$ (mol %) | $Li_2O^{1)}$ (mol %) | Temperature (° C.) | Firing Atmosphere | Density (g/cm³) |
| Experimental Example 1 | 92.73 | 7.27 | 0.00 | 97.50 | 2.50 | 0.00 | 1500 | Air | 3.67 |
| Experimental Example 2 | 90.60 | 7.00 | 2.40 | 96.18 | 2.43 | 1.39 | 1500 | Air | 3.52 |
| Experimental Example 3 | 88.30 | 6.82 | 4.88 | 94.75 | 2.39 | 2.86 | 1500 | Air | 3.41 |
| Experimental Example 4 | 88.30 | 6.82 | 4.88 | 94.75 | 2.39 | 2.86 | 1200 | Air | 2.10 |
| Experimental Example 5 | 88.30 | 6.82 | 4.88 | 94.75 | 2.39 | 2.86 | 1400 | Air | 3.32 |
| Experimental Example 6 | 88.30 | 6.82 | 4.88 | 94.75 | 2.39 | 2.86 | 1600 | Air | 3.42 |
| Experimental Example 7 | 85.29 | 6.69 | 8.02 | 92.85 | 2.38 | 4.76 | 1500 | Air | 3.31 |
| Experimental Example 8 | 64.79 | 22.01 | 13.20 | 81.81 | 9.09 | 9.09 | 1500 | Air | 3.11 |
| Experimental Example 9 | 64.79 | 22.01 | 13.20 | 81.81 | 9.09 | 9.09 | 1400 | Air | 3.03 |
| Experimental Example 10 | 44.99 | 34.39 | 20.62 | 66.66 | 16.67 | 16.67 | 1500 | Air | 2.62 |
| Experimental Example 11 | 44.99 | 34.39 | 20.62 | 66.66 | 16.67 | 16.67 | 1400 | Air | 2.49 |
| Experimental Example 12 | 92.73 | 7.27 | 0.00 | 97.50 | 2.50 | 0.00 | 1500 | $N_2$ | 3.68 |
| Experimental Example 13 | 88.30 | 6.82 | 4.88 | 94.75 | 2.39 | 2.86 | 1500 | $N_2$ | 3.61 |
| Experimental Example 14 | 100.00 | 0.00 | 0.00 | 100.00 | 0.00 | 0.00 | 1500 | $N_2$ | 3.57 |
| Experimental Example 15 | 95.70 | 2.62 | 1.68 | 98.18 | 0.88 | 0.94 | 1420 | $N_2$ | 3.59 |
| Experimental Example 16[7)] | 95.70 | 2.62 | 1.68 | 98.18 | 0.88 | 0.94 | 1420 | $N_2$ | 3.56 |
| Experimental Example 17 | 88.20 | 7.30 | 4.50 | 94.79 | 2.57 | 2.64 | 1420 | $N_2$ | 3.60 |
| Experimental Example 18[7)] | 88.20 | 7.30 | 4.50 | 94.79 | 2.57 | 2.64 | 1420 | $N_2$ | 3.55 |
| Experimental Example 19 | 100.00 | 0.00 | 0.00 | 100.00 | 0.00 | 0.00 | 1500 | Air | 3.24 |

| Composition | Open Porosity (%) | Crystal Phase | | Peak Position[5)] (°) | (B + C)/A[6)] | Li/Zr Molar Ratio |
| --- | --- | --- | --- | --- | --- | --- |
| | | Main Phase[2)] | Minor Phase[3)4)] | | | |
| Experimental Example 1 | 0.01 | MgO | $ZrO_2$, $Mg_{0.2}Zr_{0.8}O_{1.8}$ | 42.90 | 0.11 | |
| Experimental Example 2 | 0.96 | MgOss | $ZrO_2$ | 42.86 | 0.03 | 1.13 |
| Experimental Example 3 | 0.22 | MgOss | Not found | 42.82 | <0.01 | 2.33 |
| Experimental Example 4 | 37.61 | MgOss | unknown | 42.88 | <0.01 | |
| Experimental Example 5 | 0.01 | MgOss | Not found | 42.82 | <0.01 | |
| Experimental Example 6 | 0.31 | MgOss | Not found | 42.83 | <0.01 | |
| Experimental Example 7 | 0.61 | MgOss | Not found | 42.82 | <0.01 | 1.96 |
| Experimental Example 8 | 0.79 | MgOss | unknown | 42.60 | <0.01 | |
| Experimental Example 9 | 0.56 | MgOss | unknown | 42.60 | <0.01 | |
| Experimental Example 10 | 7.74 | MgOss | unknown | 42.40 | <0.01 | |
| Experimental Example 11 | 16.00 | MgOss | unknown | 42.38 | <0.01 | |
| Experimental Example 12 | 0.05 | MgO | $ZrO_2$, $Mg_{0.2}Zr_{0.8}O_{1.8}$ | 42.90 | 0.16 | |
| Experimental Example 13 | 0.02 | MgOss | Not found | 42.83 | <0.01 | |
| Experimental Example 14 | 0.30 | MgO | Not found | 42.90 | <0.01 | |
| Experimental Example 15 | 0.01 | MgOss | Not found | 42.89 | <0.01 | |
| Experimental Example 16[7)] | 0.04 | MgOss | Not found | 42.89 | <0.01 | 2.08 |
| Experimental Example 17 | 0.01 | MgOss | Not found | 42.82 | <0.01 | |
| Experimental Example 18[7)] | 0.08 | MgOss | Not found | 42.82 | <0.01 | 1.96 |
| Experimental Example 19 | 4.29 | MgO | Not found | 42.90 | <0.01 | |

[1)]Values obtained when contents of compounds containing Mg, Zr, and Li, which are contained in a starting material, are assumed to be calculated based on MgO, $ZrO_2$, and $Li_2O$, respectively, and the total content thereof is assumed to be 100 mol %
[2)]MgOss refers to an MgO—$ZrO_2$—$Li_2O$ solid solution
[3)]$Mg_{0.2}Zr_{0.8}O_{1.8}$ is a substance in which Mg is partly replaced with $ZrO_2$ and Mg is not necessarily replaced at the above ratio
[4)]unknown refers to a substance that is not identified by XRD analysis
[5)]Peak position of MgO (200)
[6)](B + C)/A: XRD peak areas of A = MgOss, B = $Mg_{0.2}Zr_{0.8}O_{1.8}$, and C = $ZrO_2$
[7)]Annealing treatment in the air at 1350° C. after the hot pressing in Experimental Examples 15 and 17

Figure 4:
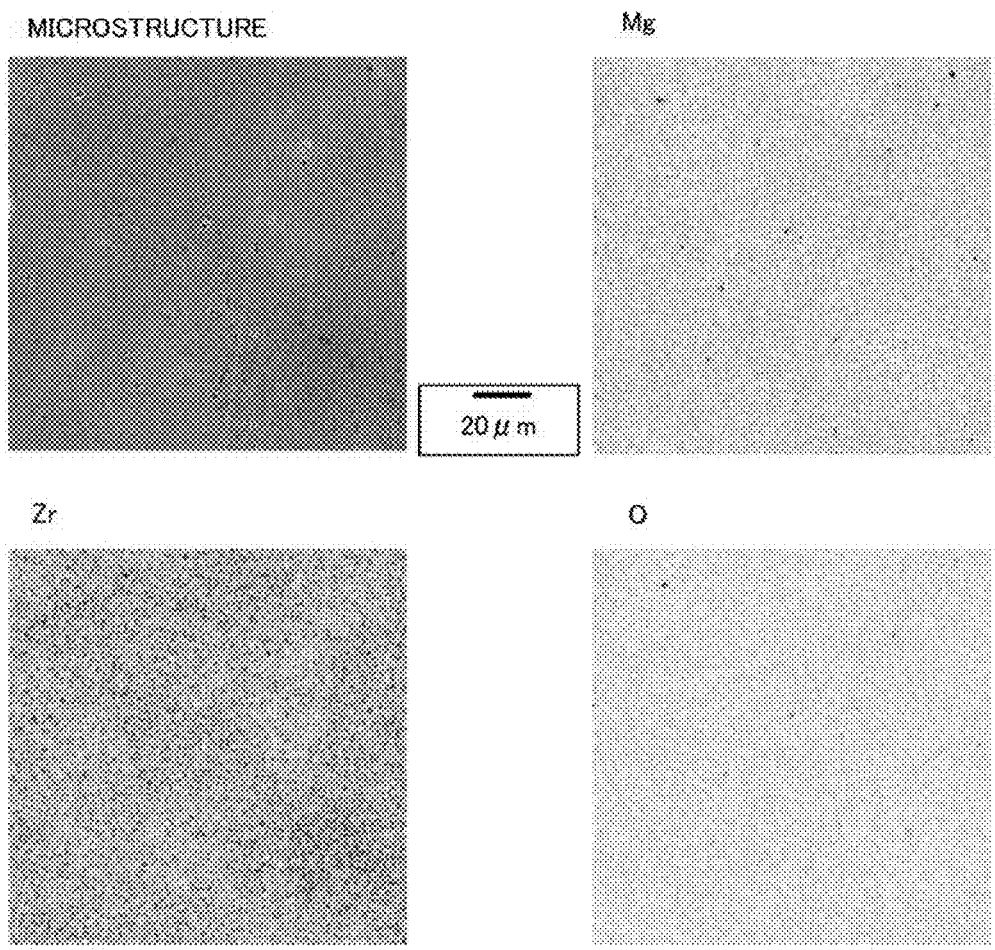
FIG. 4 shows a SEM image and an EPMA element mapping image in Experimental Example 3.

FIG. 4 is an EPMA element mapping image of Experimental Example 3. Referring to FIG. 4, the main phase of Experimental Example 3 is constituted by Mg and O and is detected in the entire region, but Zr is also detected in the entire region. Therefore, it was considered in Experimental Example 3 that an MgO—$ZrO_2$—$Li_2O$ solid solution obtained by dissolving phases were substantially not contained when the XRD peak of the (200) plane appeared at 2θ=42.82° to 42.89°.

As is clear from FIGS. 2 and 4, the substantially entire ceramic material of Experimental Example 3 was constituted by an MgO—$ZrO_2$—$Li_2O$ solid solution, and thus the ceramic material of Experimental Example 3 contained an $MgO$—$ZrO_2$—$Li_2O$ solid solution as a main phase. Also in Experimental Examples 2, 4 to 11, 13, and 15 to 18, the XRD analysis and the EPMA analysis or the microstructure observation were performed, and the $MgO$—$ZrO_2$—$Li_2O$ solid solution was found to be a main phase. Other methods may be employed as long as the volume ratio of phases can be identified. The EPMA element mapping image is color-coded with red, orange, yellow, greenish yellow, green, blue, and indigo in accordance with the concentration. Red indicates the highest concentration, indigo indicates the lowest concentration, and black indicates zero. However, FIG. 4 is a monochrome diagram, and the original colors in FIG. 4 will be described below. The ground color of Mg was yellow or greenish yellow and the ground color of Zr was green or blue. Both the elements showed a substantially uniform color in the entire region of crystal grains.

In Experimental Examples 5, 9, and 11 in which a heat treatment was performed at 1400° C., a considerable change was not observed on the solid solution state and it was found that the $MgO$—$ZrO_2$—$Li_2O$ solid solution was also obtained in a heat treatment at 1400° C. Also in Experimental Examples 15 to 18 in which a heat treatment was performed at 1420° C., a considerable change was not observed on the solid solution state and it was found that the $MgO$—$ZrO_2$—$Li_2O$ solid solution was obtained. In Experimental Example 4 in which a heat treatment was performed at 1200° C., the peak position of the (200) plane of MgO shifted, but was at a higher angle than that in the case of a heat treatment at 1500° C. and the minor phases were present. Therefore, it is believed that the reaction of $MgO$, $ZrO_2$, and $Li_2O$ did not sufficiently proceed in this firing temperature.

In Experimental Examples 13 and 15 to 18 in which hot pressing was performed in an Ns atmosphere, an $MgO$—$ZrO_2$—$Li_2O$ solid solution not including minor phases was obtained as in Experimental Example 3 in which the firing was performed in the air. This suggests that hot pressing is a better method to obtain a dense sintered body having low open porosity. As is clear from the above results, the heat treatment temperature is preferably 1200° C. or more, more preferably 1400° C. or more, and further preferably 1500° C. or more. In view of energy consumption, the firing temperature is believed to be desirably 2000° C. or less.

In Experimental Examples 16 and 18, an annealing treatment (oxidizing treatment) was performed in the air after the hot pressing in Experimental Examples 15 and 17. It was found that, even if the annealing treatment was performed, the $MgO$—$ZrO_2$—$Li_2O$ solid solution did not change and additional minor phases were not formed, and thus the ceramic material was stable. Furthermore, the ceramic materials of Experimental Examples 15 and 17 showed gray on the whole after hot. pressing, and were assumed to have oxygen defects. The ceramic materials of Experimental Examples 16 and 18 after the annealing treatment showed white on the whole, and the oxygen defects were assumed to be eliminated. Therefore, it was found to be effective in order to eliminate oxygen defects that the ceramic material is subjected to an annealing treatment in an oxidizing atmosphere after hot pressing.

To relatively compare the ratio of $Mg_xZr_{1-r}O_{2-x}$ and $ZrO_2$ to the entire solid solution, Table 1 shows a value of (B+C)/A, where A represents an area of an XRD peak of a (200) plane of the $MgO$—$ZrO_2$—$Li_2O$ solid solution, B represents an area of an XRD peak (for $Mg_{0.2}Zr_{0.8}O_{1.8}$, near $2\theta=30.49°$) of a (111) plane of $Mg_xZr_{1-r}O_{2-x}$, and C represents an area of an XRD peak (near $2\theta=31.46°$) of a (111) plane of $ZrO_2$. As the value of (B+C)/A decreases, the content of the $MgO$—$ZrO_2$—$Li_2O$ solid solution in the ceramic material increases and the contents of $Mg_xZr_{1-r}O_{2-x}$ and $ZrO_2$ serving as minor phases decrease. In Experimental Examples 3, 5 to 7, and 15 to 18 the value of (B+C)/A was substantially zero, and $Mg_xZr_{1-r}O_{2-x}$ and $ZrO_2$ serving as minor phases were substantially not contained. Therefore, these ceramic materials were suitably used for sputtering target members. In Experimental Examples 4 and 8 to 11, (B+C)/A was substantially zero, but unidentified minor phases were present in a trance amount.

Figure 5:
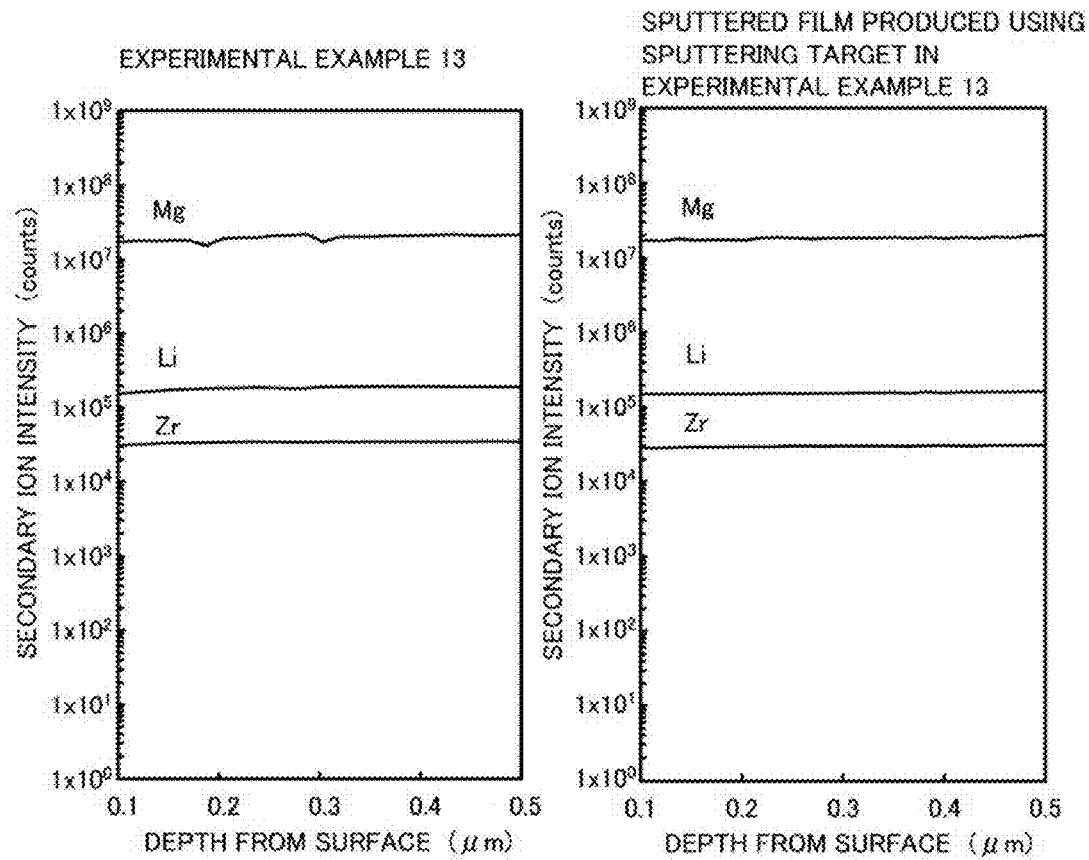
FIG. 5 shows SIMS measurement results of Experimental Example 13 and a sputtered film produced from Experimental Example 13.

Next, sputtered films produced using the sputtering targets formed of the materials in Experimental Examples 13 and 14 were subjected to XRD analysis and SIMS analysis. In the sputtered film produced from the material in Experimental Example 13, minor phases other than MgO were not found from the XRD analysis. In both the sputtered films produced from the targets in Experimental Examples 13 and 14, the XRD peak of the (111) plane shifted, to lower angles compared with the sintered bodies. The XRD peak, of the (111) plane of the sputtered film in Experimental Example 13 further shifted to lower angles by 0.08° compared with the XRD peak of the (111) plane of the sputtered film in Experimental Example 14. The shift to lower angles in the sputtered film in Experimental Example 14 is believed to be due to the influence of a deposition substrate. Although the shift in the sputtered film in Experimental Example 13 is also believed to be due to such an influence, the XRD peak in the sputtered film in Experimental Example 13 further shifted to lower angles. This may be because zirconium oxide and lithium oxide were dissolved in magnesium oxide. FIG. 5 shows the SIMS measurement results of the ceramic material in Experimental Example 13 and the sputtered film produced from the ceramic material in Experimental Example 13. The secondary ion intensities of Mg, Li, and Zr were measured at a depth of about 0.1 μm to 0.5 μm from the outermost surface in order to remove the influence of contaminants and the like on the outermost surface. In FIG. 5, the horizontal, axis shows the depth from the surface and the vertical axis shows the secondary ion intensity of each element. Since there is no significant difference in the secondary ion intensities of Mg, Zr, and Li between the sintered body and the sputtered film, the sintered body and the sputtered film are believed to have substantially the same composition. In the XRD analysis, the peak shift to lower angles was observed compared with the sputtered film constituted by only MgO in Experimental Example 14 and the minor phases were not observed. In the SIMS analysis, the sintered body and the sputtered film had substantially the same composition. Therefore, it was found that the $MgO$—$ZrO_2$—$Li_2O$ solid solution was also formed in the film body produced from the ceramic material by sputtering. It is known that the crystal plane that appears in the sputtered film is dependent on the ultimate vacuum of an apparatus, and thus a film having a crystal plane other than (111) can be formed by controlling the ultimate vacuum (Reference Document: J. Vac. Soc. Jpn. Vol. 43, No. 2, 2000 (p 135)).

As described above in detail, the produced ceramic material can provide a sputtering target in which $ZrO_2$ and $Li_2O$ are dissolved in part of MgO at room temperature. This is assumed to be as follows. Part of Mg is replaced with Zr and the thus-formed cation defects are replaced with Li. As a result, the electro-neutrality is kept without forming cation defects. In particular, when minor phases are not formed, a sputtering target that is used in a simple apparatus and process compared with co-sputtering and that does not easily generate dust compared with a composite target can be produced. Furthermore, since a solid solution is obtained in which part of MgO is replaced with $ZrO_2$ and $Li_2O$ at room temperature, a film body in which part of MgO is replaced with $ZrO_2$ and Li$_2$O can be produced by sputtering. Cation defects are not easily formed in this film body for the above reason. Therefore, when an MTJ element is produced, it is likely that the magnetoresistance ratio is maintained and also a tunnel barrier is produced in which, the tunnel resistance can be artificially changed, for example, the tunnel resistance is decreased due to the influence of Zr and Li.

The present application claims priority from Japanese Patent Application No. 2012-245464 filed on Nov. 7, 2012, the entire contents of which are incorporated herein by reference.

INDUSTRIAL APPLICABILITY

The ceramic material of the present invention is used as a sputtering target member for producing a magnetic tunnel junction, element such as a magnetic head of a hard disk and a magnetoresistive random access memory.

What is claimed is:

1. A ceramic material comprising magnesium, zirconium, lithium, and oxygen as main components, wherein a crystal phase of a solid solution obtained by dissolving zirconium oxide and lithium oxide in magnesium oxide is a main phase.

2. The ceramic material according to claim 1, wherein an XRD peak of a (200) plane of the solid solution measured with CuKα rays appears at 2θ=42.89° or less which is smaller than an angle at which a peak of a cubic crystal of magnesium oxide appears.

3. The ceramic material according to claim 1, wherein a XRD peak of a (200) plane of the solid solution measured with CuKα rays appears at 2θ=42.38° to 42.89°.

4. The ceramic material according to claim 1, wherein a XRD peak of a (200) plane of the solid solution measured with CuKα rays appears at 2θ=42.82° to 42.89°.

5. The ceramic material according to claim 1, wherein (B+C)/A is lower than 0.11, where A represents an XRD peak area of the (200) plane of the solid solution, B represents an XRD peak area of a (111) plane of Mg$_x$Zr$_{1-r}$O$_{2-x}$ (0<x<0.25) serving as a minor phase, and C represents an XRD peak area of a (111) plane of ZrO$_2$ serving as a minor phase.

6. The ceramic material according to claim 1, wherein a molar ratio Li/Zr of Li to Zr is 1.96 or more and 2.33 or less.

7. The ceramic material according to claim 1, wherein, assuming that contents of compounds containing magnesium, zirconium, and lithium, the compounds being contained in a starting material, are respectively calculated based on magnesium oxide (MgO), zirconium oxide (ZrO$_2$), and lithium oxide (Li$_2$O) and a total content of the magnesium oxide, the zirconium oxide, and the lithium oxide is 100 mol %, a content of the magnesium oxide is 60.0 mol % or more and 99.8 mol % or less, a content of the zirconium oxide is 0.1 mol % or more and 20.0 mol % or less, and a content of the lithium oxide is 0.1 mol % or more and 20.0 mol % or less.

8. The ceramic material according to claim 1, wherein, assuming that contents of compounds containing magnesium, zirconium, and lithium, the compounds being contained in a starting material, are respectively calculated based on magnesium oxide (MgO), zirconium oxide (ZrO$_2$), and lithium oxide (Li$_2$O) and a total content of the magnesium oxide, the zirconium oxide, and the lithium oxide is 100 mol %, a content of the magnesium oxide is 90.0 mol % or more and 99.8 mol % or less, a content of the zirconium oxide is 0.1 mol % or more and 5.0 mol % or less, and a content of the lithium oxide is 0.1 mol % or more and 5.0 mol % or less.

9. The ceramic material according to claim 1, wherein in the solid solution, an XRD peak measured with CuKα rays shifts to lower angles with respect to an XRD peak of magnesium oxide measured with CuKα rays.

10. The ceramic material according to claim 1, wherein in the solid solution, an XRD peak measured with CuKα rays shifts to lower angles by 0.01° or more and 0.10° or less with respect to an XRD peak of magnesium oxide measured with CuKα rays.

11. The ceramic material, according to claim 9, being formed in a film-like shape.

12. The ceramic material, according to claim 10, being formed in a film-like shape.

13. A sputtering target member comprising the ceramic material according to claim 1.

14. The sputtering target member according to claim 13, being used for producing a tunnel barrier of a magnetic tunnel junction element.

15. The sputtering target member according to claim 14, being used for producing the magnetic tunnel junction element, the magnetic tunnel junction element being at least one of a magnetic head of a hard disk and a magnetoresistive random access memory.

* * * * *